US006259105B1

(12) United States Patent
Eddy et al.

(10) Patent No.: US 6,259,105 B1
(45) Date of Patent: Jul. 10, 2001

(54) SYSTEM AND METHOD FOR CLEANING SILICON-COATED SURFACES IN AN ION IMPLANTER

(75) Inventors: Ronald J. Eddy, Salem; Peter M. Kopalidis, Arlington, both of MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/309,466

(22) Filed: May 10, 1999

(51) Int. Cl.[7] ...................................................... H01J 37/36
(52) U.S. Cl. ............................ 250/492.21; 250/492.2; 250/398; 134/1.1; 134/1.2; 134/22.1
(58) Field of Search ........................ 250/492.21, 492.2, 250/398; 134/1.1, 1.2, 22.1

(56) References Cited

U.S. PATENT DOCUMENTS

| | | | |
|---|---|---|---|
| 4,923,828 | * | 5/1990 | Gluck et al. ............................ 437/225 |
| 5,554,854 | | 9/1996 | Blake ................................. 250/492.21 |
| 5,633,506 | * | 5/1997 | Blake ................................. 250/492.21 |
| 5,779,849 | | 7/1998 | Blalock ................................. 156/345 |
| 5,843,239 | | 12/1998 | Shrotriya .................................. 134/1.1 |

\* cited by examiner

Primary Examiner—Jack Berman
Assistant Examiner—Nikita Wells
(74) Attorney, Agent, or Firm—John A. Kastelic

(57) ABSTRACT

A method and system for controllably stripping a portion of silicon (98) from a silicon coated surface, for example, from an interior portion of an ion implanter (10). The system comprises (i) a source (80) of gas comprised at least partially of a reactive gas, such as fluorine; and (ii) a dissociation device (70) such as a radio frequency (RF) plasma source located proximate the silicon coated surface for converting the reactive gas to a plasma of dissociated reactive gas atoms and for directing the dissociated reactive gas atoms toward the silicon coated surface. A control system (102) determines the rate of removal of the silicon (98) from the surface by controlling (i) a rate of source gas flow into and the amount of power supplied to the dissociation device, and (ii) the time of exposure of the silicon coated surface to the plasma. The invention is useful, among other things, for removing a contaminant-laden layer of silicon from a wafer-supporting disk (40) in an ion implanter, wherein the silicon coated surface has been formed by applying a layer (98) of silicon onto the surface by a plasma enhanced physical vapor deposition (PECVD) process.

20 Claims, 3 Drawing Sheets

SYSTEM AND METHOD FOR CLEANING SILICON-COATED SURFACES IN AN ION IMPLANTER

RELATED APPLICATION

The following U.S. patent applications are incorporated by reference herein as if they had been fully set forth: Application Ser. No. 09/309,096 filed May 10, 1999 now U.S. Pat. No. 6,221,169 issued Apr. 24, 2001 and entitled System and Method for Cleaning Contaminated Surfaces in an Ion Implanter.

FIELD OF THE INVENTION

The present invention relates generally to the field of ion implanters, and more specifically to an improved system and method for cleaning silicon coated surfaces of an ion implanter.

BACKGROUND OF THE INVENTION

Ion implantation has become the technology preferred by industry to dope semiconductors with impurities in the large-scale manufacture of integrated circuits. Ion dose and ion energy are the two most important variables used to define an implant step. Ion dose relates to the concentration of implanted ions for a given semiconductor material. Typically, high current implanters (generally greater than 10 milliamps (mA) ion beam current) are used for high dose implants, while medium current implanters (generally capable of up to about 1 mA beam current) are used for lower dose applications.

Ion energy is the dominant parameter used to control junction depth in semiconductor devices. The energy levels of the ions which make up the ion beam determine the degree of depth of the implanted ions. High energy processes such as those used to form retrograde wells in semiconductor devices require implants of up to a few million electron volts (MeV), while shallow junctions may only demand ultra low energy (ULE) levels below one thousand electron volts (1 KeV).

A typical ion implanter comprises three sections or subsystems: (i) an ion source for outputting an ion beam, (ii) a beamline including a mass analysis magnet for mass resolving the ion beam, and (iii) a target chamber which contains the semiconductor wafer or other substrate to be implanted by the ion beam. Ion sources in ion implanters typically generate an ion beam by ionizing within a source chamber a source gas, a component of which is a desired dopant element, and extracting the ionized source gas in the form of an ion beam.

Internal parts of ion implanters located along the beamline and in the target chamber may become contaminated during the course of continued operation. In high current ion implanters, for example, target wafers are positioned on the periphery of an aluminum disk within the target chamber. The disk is both rotated and translated past a stationary ion beam so that the beam implants ions into the entire surface of the wafer. As a result, portions of the disk not covered by a wafer become implanted with the dopant element, which can be problematic for two reasons.

First, because ion implanters are operated using a variety of process recipes, different types of source gases are run in the source to obtain ion beams comprising the desired species of dopant ions. If, however, the target disk (or other beamline component) becomes contaminated by implantation of a species during a previous process recipe (e.g., one involving phosphorous), a later process recipe (e.g., one involving arsenic) may be adversely effected by this cross-contamination. Second, for a particular process recipe, aluminum contamination may present a problem if the ion beam impact with the disk surface causes sputtering of the disk material.

A known solution to the problem of disk surface material sputtering is to coat the disk with silicon. However, the coated disk still presents cross-contamination problems as the silicon layer on the disk is implanted with the particular species being run. Accordingly, it is an object of the present invention to provide a system and method for cleaning surfaces to remove contaminants therefrom. It is a further object to provide such a system and method for use in cleaning surfaces of components in ion implanters or other vacuum processing equipment. It is still a further object to provide such a system and method for cleaning an ion implanter target disk.

SUMMARY OF THE INVENTION

A method and system for controllably stripping a portion of silicon from a silicon coated surface, for example, from an interior portion of an ion implanter. The system comprises (i) a source of gas comprised at least partially of a reactive gas, such as fluorine; and (ii) a dissociation device such as a radio frequency (RF) powered plasma source located proximate the silicon coated surface for converting the source gas to a plasma of dissociated reactive gas atoms and for directing the dissociated reactive gas atoms in the plasma toward the silicon coated surface to be stripped. A control system determines the rate of removal of the silicon from the surface by controlling (i) a rate of source gas flow into and the amount of power supplied to the dissociation device, and (ii) the time of exposure of the silicon coated surface to the plasma. The invention is useful, among other things, for removing a contaminant-laden layer of silicon from a wafer-supporting disk in an ion implanter, wherein the silicon coated surface has been formed by applying a layer of silicon onto the surface by a plasma enhanced physical vapor deposition (PECVD) process.

DETAILED DESCRIPTION OF A PREFERRED EMBODIMENT

Figure 1:
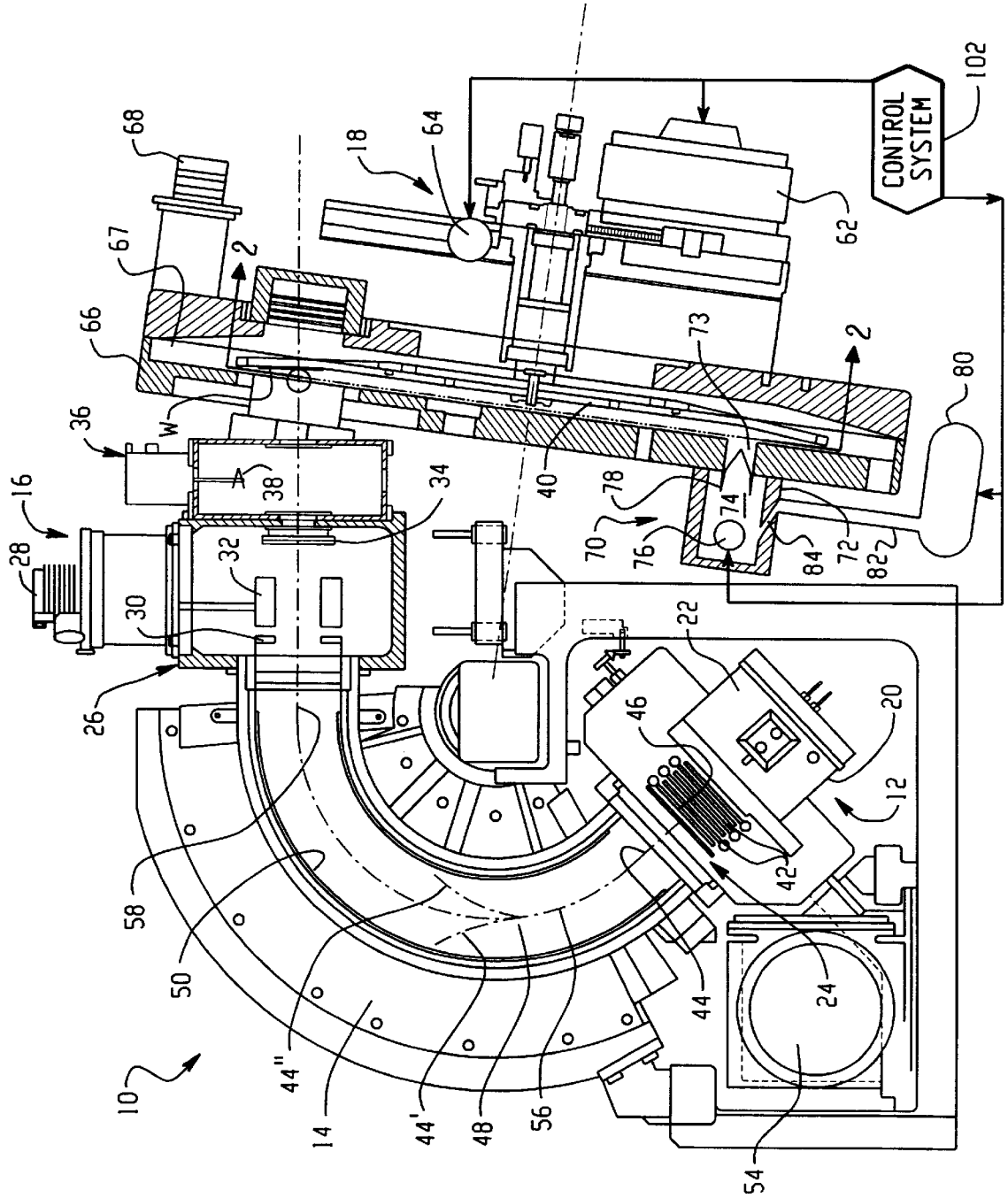
FIG. 1 is a cross sectional plan view of an ion implantation system into which is incorporated one embodiment of a stripping device constructed according to the principles of the present invention.

Referring now to the drawings, FIG. 1 discloses an ion implanter, generally designated 10, which comprises an ion source 12, a mass analysis magnet 14, a beamline assembly 16, and a target or end station 18. One application of the present invention is in a low energy implanter, such as that shown in FIG. 1, wherein the beamline assembly 16 is relatively short due to the tendency of a low energy beam to expand (i.e., "blow-up") during propagation thereof.

The ion source 12 comprises a housing 20 that defines a plasma chamber 22, and an ion extractor assembly 24. The beamline assembly 16 includes (i) a resolving housing 26 which is evacuated by vacuum pump 28 and which contains a terminal aperture 30, a resolving aperture 32, and a flag Faraday 34; and (ii) a beam neutralizer 36 which contains an electron shower 38, none of which form a part of the present invention. Downstream of the beam neutralizer 36 is the end station 18, which includes a disk-shaped wafer support disk 40 upon which wafers W to be treated are mounted. As used herein, wafer shall include any type of substrate, which may be implanted with an ion beam.

Energy is imparted to the ionizable dopant gas to generate ions within the plasma chamber 22. Generally, positive ions are generated, although the present invention is applicable to systems wherein negative ions are generated by the source. The positive ions are extracted through a slit in the plasma chamber 22 by the ion extractor assembly 24 which comprises a plurality of electrodes 42. Accordingly, the ion extractor assembly functions to extract a beam 44 of positive ions from the plasma chamber through an extraction aperture plate 46 and accelerate the extracted ions toward the mass analysis magnet 14.

The mass analysis magnet 14 functions to pass only ions of an appropriate charge-to-mass ratio to the beamline assembly 16. The mass analysis magnet 14 includes a curved beam path 48 which is defined by an aluminum beam guide 50 connected to the source 12, evacuation of which is provided by a vacuum pumps 28 and 54. The ion beam 44 that propagates along this path is affected by the magnetic field generated by the mass analysis magnet 14.

The magnetic field causes the ion beam 44 to move along the curved beam path 48, from a first or entrance trajectory 56 near the ion source 12 to a second or exit trajectory 58 near the resolving housing 26. Portions 44' and 44" of the beam 44 comprised of ions having an inappropriate charge-to-mass ratio are deflected away from the curved trajectory and into the walls of aluminum beam guide 50. In this manner, the magnet 14 passes to the beamline assembly 16 only those ions in the beam 44 that have the desired charge-to-mass ratio.

The wafer support disk 40 at the end station 18 is rotated by motor 62. The disk shaped support disk 40, having wafers mounted thereon, is rotated at a constant angular velocity by motor 62, and support disk 40 is moved vertically (into and out of the page of FIG. 1) by motor 64 and a lead screw (not shown). As such, the entire surface of a wafer may be implanted by a stationary beam which at any given time covers only a small portion of the wafer. The disk 40 and the wafers positioned thereon are contained within a process chamber housing 66 the interior chamber 67 of which is evacuated by a roughing pump 68.

Figure 2:
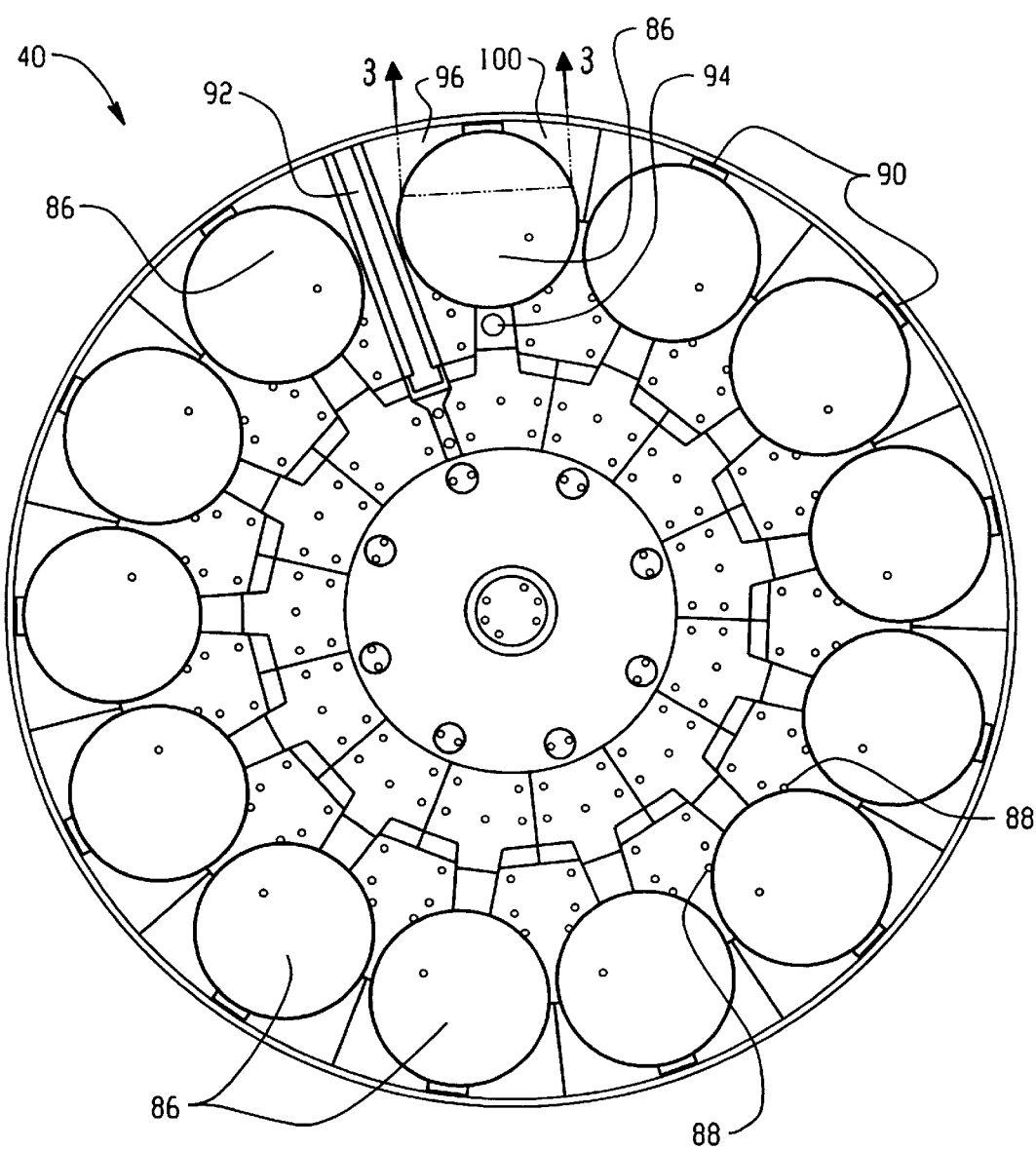
FIG. 2 is a plan view of the wafer support disk of the ion implanter of FIG. 1 taken along the lines 2—2.
Figure 3:
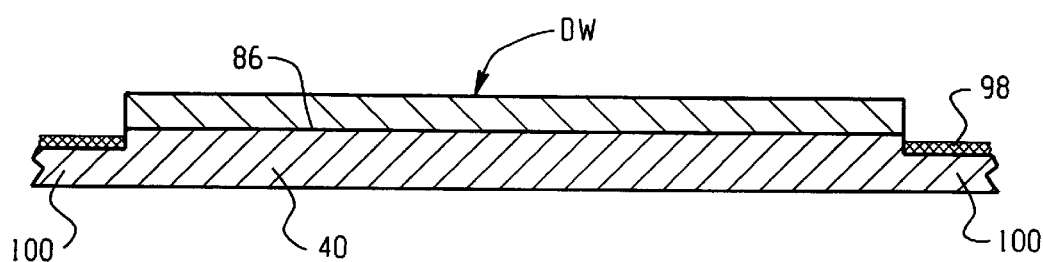
FIG. 3 is a cross sectional view of the support disk of FIG. 2, taken along the lines 3—3.

The wafer support disk 40 is made of aluminum and coated with silicon in order to prevent aluminum sputtering during implantation processes (see also FIGS. 2 and 3). The present invention is embodied in the form of a dissociation device 70 that controllably strips a finite layer of silicon from the disk to remove any contaminants that may be implanted into the layer. As used herein, the terms "erode", "clean", "etch", "remove" and "strip" all refer to selective removal of silicon from the wafer support disk 40.

The dissociation device 70 comprises a housing 72 that is mounted to the process chamber housing 66, using bolts or other standard fasteners, at the location of an aperture or opening 73. The interior of the housing 72 provides a dissociation chamber 74 that is powered by energized element 76. Although shown inside the chamber 74, the energized element 76 may be located outside of the chamber 74 and enabled to direct energy into the chamber where dissociation occurs. The dissociation device 70 also includes a nozzle 78 for directing dissociated reactive gas atoms from inside the chamber 74 toward the support disk 40. A stripping gas source 80 is connected to the housing 72 by means of a conduit 82 and housing inlet 84.

As shown in FIG. 2, the support disk 40 is a generally circular element comprised of aluminum having, in this case, thirteen slightly raised disk pedestals 86 in which a wafer W may be held. As shown in FIG. 2, no wafers W are positioned on the support disk. Clamping pins 88 and a stop 90 positively positions the wafer upon the disk. A disk current slot 92 permits a portion of the ion beam passing through the disk to be analyzed, and charge sensors 94 provide information regarding wafer charging.

As shown in FIG. 3, the wafer support disk 40 is coated with a layer 98 of silicon. The silicon covers the entire disk 40, except for the pedestals 86 upon which the wafers are positioned and the portions 100 of the disk between and around adjacent pedestals. The silicon layer 98 is applied by a plasma enhanced chemical vapor deposition (PECVD) process. Surmet Corporation of Burlington, Mass. is in the business of providing such PECVD silicon coatings. As opposed to a plasma or flame spray application of silicon, which provides a highly granular surface having unpredictable etching characteristics, a PECVD application of silicon provides a homogenous, uniform surface grain structure that exhibits predictable etching rates. Preferably, the grain size is sufficiently small and of sufficiently high density to provide surface finish of Ra=0.2–0.4 micron ($\mu$m) in order to insure predictable uniformity and repeatability of silicon removal.

The silicon coating is applied so that a layer having a depth of about 25 microns is deposited on the surface of the disk 40. Such a depth is considerably more than would otherwise be deposited on the disk 40, in the anticipation that a selected depth of the layer will be uniformly removed (etched) at regular operating intervals using the system and process of the present invention.

During implantation, both the wafers W installed on the pedestals 86, and the portions 100 of the disk between and around adjacent pedestals, are implanted with dopant ions. The implanted ions within the portions 100 of the disk 40, outside of the wafer locations, may present contamination problems in subsequent implants.

It has been found that implanted ions (e.g., boron or phosphorous) are implanted into portions 100 of the disk at depths of up to about 1000 Angstroms (Å), or 0.1 micron ($\mu$m). However, it has also been found that by removing a layer of silicon of only about 500 Å (0.05 $\mu$m), a significant majority of the implanted species is removed from the disk 40. Because the silicon layer 98 has an original thickness of about 25 microns (generally within the range of 18–35 microns), theoretically the disk 40 may be stripped/etched up to 500 times before the entire silicon layer 98 has been etched away.

The preferred stripping/cleaning/etching agent used in the dissociation device 70 is free chlorine or, preferably, free fluorine, which may be obtained in any of several manners. For example, fluorine may be found in commercially available gases such as $NF_3$, $CF_4$, or $C_2F_6$. The use of $SF_6$ is also possible, though less desirable due to the increased likelihood of sulfur contamination. $F_2$ is yet another possible fluorine source, although in such a form, presents minor handling difficulties.

In a preferred embodiment, the fluorine-containing gas is a nonreactive gas stored in source or tank 80 and introduced into the dissociation chamber 74 via conduit 82 and housing inlet 84. The energized element 76 may be, for example, an antenna powered by either a microwave source or a radio frequency (RF) source, or an electrically heated filament. A typical operating range for a microwave source is on the order or 2.45 gigahertz (GHz), for a RF source is on the order of 13.56 (MHz), and for a heated filament on the order of 2000° to 3000° Celsius (C.).

In all cases, the energized element 76 energizes the source gas, which includes a reactive species component such as fluorine, to create either a plasma or other supply of dissociated reactive atomic fluorine radicals. The nozzle 78 provides both a pathway to the disk 40 to be etched. Once the fluorine-containing gas is dissociated into reactive atomic fluorine radicals, the reactive atomic fluorine radicals in the plasma may be directed by nozzle 78 toward the silcon layer 98.

Dummy wafers DW are installed on the pedestals 86 so that the wafer-supporting portions of the disk 40, which have not been contaminated, are not cleaned. Thus, only portions 100 of the disk between and around the pedestals 86 are subject to the silicon stripping process. The disk 40 is rotated and translated vertically so that the entirety of portions 100 is exposed to the reactive atomic species in the plasma to effectuate silicon stripping.

The mechanism for the controlled removal of silicon is believed to be a three step process: (i) adsorption of the reactive atomic fluorine radicals into or onto the silicon surface; (ii) surface reaction of the silicon with the reactive atomic fluorine radicals to form volatile reaction products; and (iii) desorption of these reaction products into the gas phase. In addition, because the reaction products are volatile and in a gaseous phase, they are continuously removed from the process chamber 67 by the evacuation pump 68.

Free non-ionized fluorine atoms are found to be the most reactive with the portions 100 of silicon layer 98 that are stripped. $F_2$, and F+ and F− ions are found to be less reactive. The method and rate at which the reactive fluorine atoms etch the silicon layer may be carefully controlled by monitoring and controlling several operating parameters. First, the gas flow rate from the tank 80 to the dissociation chamber 74 may be controlled to determine the amount of source gas available to be dissociated into reactive fluorine radicals. The gas flow rate will generally determine the pressure in the process chamber 67, because the speed of the evacuation pump 68 and the volume of the process chamber 67 remain fixed.

Other factors determine the method and rate of silicon etching. For example, the gas introduced into chamber 74 may be diluted with an inert gas such as argon or nitrogen to reduce the amount of fluorine available for dissociation. Next, the power applied to the energization element 76 may be controlled to determine the rate of dissociation. Related to the power applied to energization element is the manner of plasma creation or source gas dissociation, based on the type of energy imparted to the fluorine-containing gas (e.g., microwave, RF or thermal). In addition, the duration of time during which the silicon layer 98 is exposed to the reactive fluorine atoms may be controlled. In connection with this exposure time, the rotation and translation speed of the disk 40 may be controllably varied.

A comprehensive control system 102 or separate control systems may be utilized to monitor and control some or all of these parameters to precisely control the etch rate of the silicon layer 98, as well as the total amount or depth of silicon etched by the reactive fluorine atoms. In one embodiment of the invention, undiluted sulfur hexafluoride ($SF_6$) gas flowed from the tank 80 to the dissociation chamber 74 at a rate of 5.5 standard liters per minute (slm), a microwave energization element 76 operated at a power level of 2 kilowatts (kW), and the silicon coated layer 98 of the disk 40 was exposed to the microwave-generated plasma for sixty (60) seconds.

Figure 4:
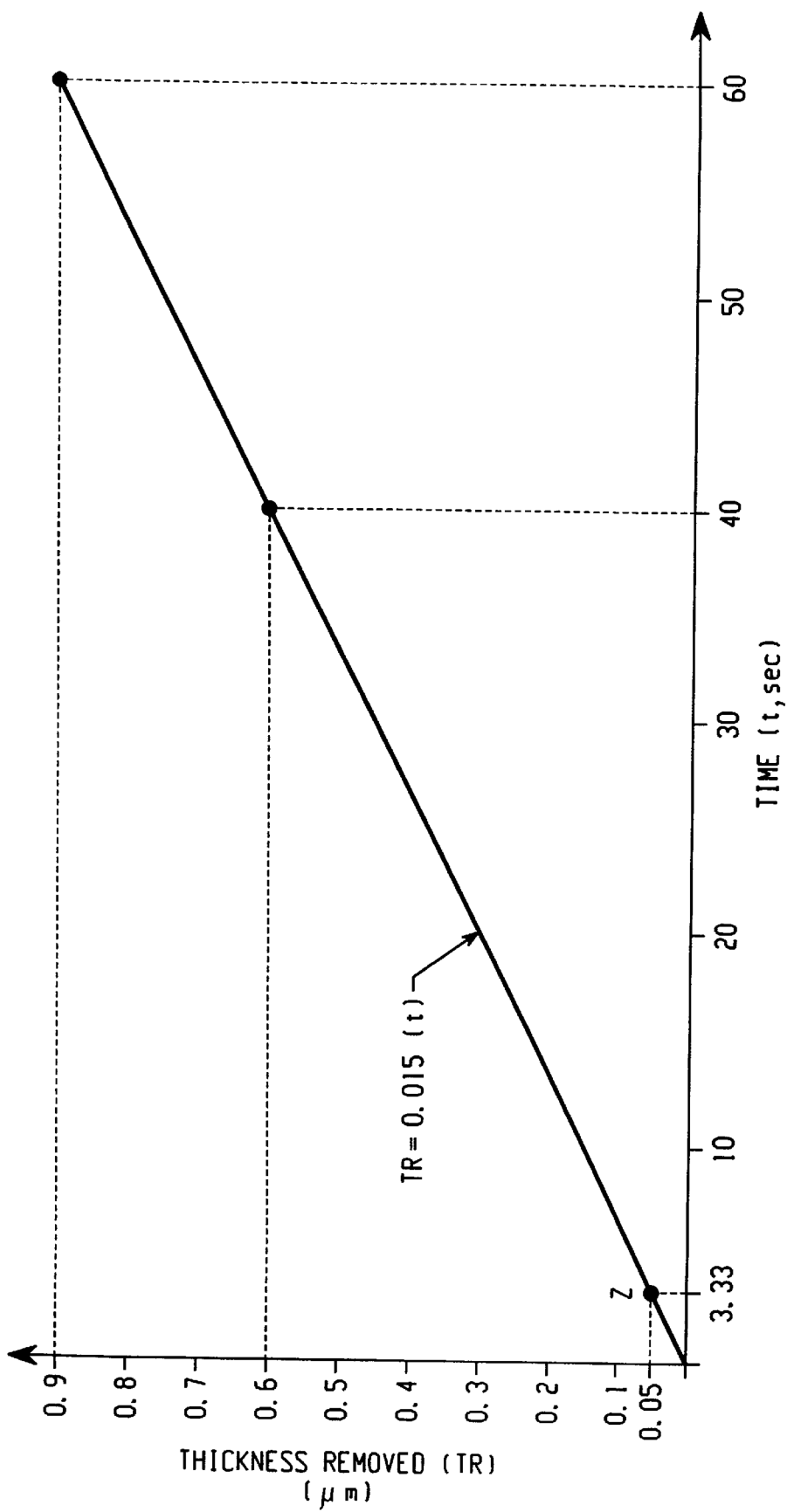
FIG. 4 is a graphical representation of silicon removal achieved using the present invention as a function of time.

FIG. 4 shows the results of silicon removal from the disk 40. At the end of sixty (60) seconds, 0.9 $\mu$m of silicon was removed from the disk, along with any contaminants (e.g., phosphorous) contained within the removed material. After forty (40) seconds, 0.6 $\mu$m of silicon had been removed. Because the rate of silicon removal is constant over time, it can be estimated that 0.05 $\mu$m (500 Å) of silicon may be removed in approximately 3.33 seconds. This estimation is based on the formula:

$$\text{Thickness removed } (TR)=0.015 \times \text{time } (t) \text{ in seconds.}$$

The exposure time above refers to an area of about one square inch on the surface of the disk 40, so the total exposure time for the entire disk to be cleaned can be found by multiplying by the total area to be cleaned. Of course, the silicon removal rate will change based on the variety of factors outlined above. For example, one type of dissociation device 70 that may be useful in the present invention is a radio frequency (RF) plasma generator sold as the Astron™ model under the brand name Astex®, which is a registered trademark of Applied Science and Technology, Inc. of Woburn, Mass. Such a plasma generator typically operates at a lower flow rate (and hence lower pressure), although at a higher level of power (e.g., 3 kW) than that indicated in the data above.

An optical emission spectroscopy (OES) system may be used to monitor the constituency of the gases present at the surface of the disk within the process chamber housing 66. For example, if phosphorous contamination is present in the portion of silicon layer 98 to be removed from the disk, the reaction products created will be in the family of phosphorous fluorides (e.g., PF, $PF_2$, or $PF_3$). At some point in the monitoring process, the amount of phosphorous fluorides will drop off, indicating that the majority of phosphorous contamination has been removed from the silicon layer 98. In this manner, the cleaning process may be optimized so that an unnecessarily large amount of silicon is not removed, which would waste both time and silicon.

Accordingly, a preferred embodiment of a method and system for selective and controlled etching of a silicon-coated surface has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. A system for controllably stripping a portion of silicon (98) from a silicon coated surface, comprising:
   (i) a source (80) of gas comprised at least partially of a reactive gas; and
   (ii) a dissociation device (70) located proximate the silicon coated surface for converting said source gas to a plasma containing dissociated reactive gas atoms, said dissociation device comprising (a) an energization element (76) for directing energy into a dissociation chamber (74) wherein gas-to-plasma conversion occurs; and (b) a nozzle (78) for directing said dissociated reactive gas atoms in the plasma toward the silicon coated surface.

2. The system of claim 1, further comprising a control system (102) for determining a rate of removal of said silicon (98) from said surface by controlling (i) a rate of source gas flow into said dissociation chamber (74); (ii) power supplied to said energization element (76) to control a rate of said gas-to-plasma conversion, and (ii) a time of duration of exposure of the silicon coated surface to said reactive gas atoms.

3. The system of claim 2, wherein the silicon coated surface forms an interior portion of a piece of vacuum processing equipment (10).

4. The system of claim 3, wherein said reactive gas atoms are fluorine atoms.

5. The system of claim 4, wherein the silicon coated surface is formed by applying a layer (98) of silicon onto the surface by a plasma enhanced physical vapor deposition (PECVD) process.

6. The system of claim 5, wherein the silicon coated surface is formed by applying a layer (98) of silicon having a thickness within the range of 18–35 microns ($\mu$m).

7. The system of claim 5, wherein the silicon coated surface forms an interior portion of an ion implanter (10).

8. The system of claim 7, wherein the interior portion of the ion implanter is a wafer-supporting disk (40).

9. The system of claim 8, wherein control system (102) rotates and translates vertically said wafer-supporting disk (40) past said nozzle (78) to control the duration of exposure of the silicon coated surface to said reactive gas atoms.

10. The system of claim 8, wherein said dissociation device (70) is a radio frequency (RF) plasma source.

11. A method for controllably stripping a portion of silicon (98) from a silicon coated surface in a vacuum chamber (67), comprising:
  (i) providing a source (80) of gas comprised at least partially of a reactive gas;
  (ii) converting, in a dissociation chamber (74), said source gas to a plasma containing dissociated reactive gas atoms by using energy from an energization element (76);
  (iii) directing a flow of said dissociated reactive gas atoms in the plasma toward the silicon coated surface;
  (iv) adsorbing the dissociated reactive gas atoms into or onto the silicon surface;
  (v) reacting the surface of said silicon with the dissociated reactive gas atoms to form volatile reaction products; and
  (vi) desorbing said volatile reaction products into a gas phase.

12. The method of claim 11, further comprising the step of removing said reaction products in the gas phase from said vacuum chamber (67) by evacuating said chamber with a pump (68).

13. The method of claim 12, wherein said reactive gas atoms are fluorine atoms.

14. The method of claim 13, further comprising the step of diluting said source (80) of gas with an inert gas.

15. The method of claim 13, wherein approximately 500 Å (0.05 $\mu$m) of silicon is stripped from the surface.

16. The method of claim 13, further comprising the step of determining a rate of removal of said silicon (98) from said surface by controlling (i) a rate of source gas flow into said dissociation chamber (74); (ii) power supplied to said energization element (76) to control a rate of said gas-to-plasma conversion, and (ii) a time of duration of exposure of the silicon coated surface to said reactive gas atoms.

17. The method of claim 16, wherein the silicon coated surface is formed by applying a layer (98) of silicon onto the surface by a plasma enhanced physical vapor deposition (PECVD) process.

18. The method of claim 16, wherein the vacuum chamber (67) is part of an ion implanter (10), and wherein the silicon coated surface is a wafer-supporting disk (40) disposed within said vacuum chamber (67).

19. The method of claim 18, wherein said step of controlling the time of duration of exposure of the silicon coated surface to said reactive gas atoms comprises rotating and vertically translating said wafer-supporting disk (40) past said flow of dissociated reactive gas atoms.

20. The method of claim 18, wherein said steps of converting said source gas to a plasma and directing said dissociated reactive gas atoms toward the silicon coated surface are accomplished using a radio frequency (RF) powered plasma source.

* * * * *